United States Patent
Hirose et al.

(10) Patent No.: US 12,027,441 B2
(45) Date of Patent: Jul. 2, 2024

(54) CONDUCTIVE HEAT RADIATION FILM, METHOD OF MANUFACTURING THE SAME, AND METHOD OF MANUFACTURING ELECTRONIC DEVICE

(71) Applicant: Fujitsu Limited, Kawasaki (JP)

(72) Inventors: Shinichi Hirose, Yokohama (JP); Daiyu Kondo, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 18/346,465

(22) Filed: Jul. 3, 2023

(65) Prior Publication Data

US 2024/0047299 A1    Feb. 8, 2024

Related U.S. Application Data

(62) Division of application No. 16/840,621, filed on Apr. 6, 2020, now Pat. No. 11,735,493.

(30) Foreign Application Priority Data

May 8, 2019    (JP) .................. 2019-088241

(51) Int. Cl.
  *H01L 23/373*    (2006.01)
  *H01L 21/48*    (2006.01)
  *H01L 23/367*    (2006.01)
(52) U.S. Cl.
  CPC ...... *H01L 23/3733* (2013.01); *H01L 21/4871* (2013.01); *H01L 23/3675* (2013.01)

(58) Field of Classification Search
  None
  See application file for complete search history.

(56) References Cited

U.S. PATENT DOCUMENTS

| | | | |
|---|---|---|---|
| 8,194,407 B2 | 6/2012 | Yamaguchi et al. | |
| 2010/0021736 A1 | 1/2010 | Slinker et al. | |
| 2010/0172101 A1 | 7/2010 | Yao et al. | |
| 2010/0261343 A1* | 10/2010 | Mizukoshi ............ | B82Y 10/00 257/E21.294 |
| 2011/0032678 A1 | 2/2011 | Altman et al. | |
| 2019/0010376 A1 | 1/2019 | Inoue et al. | |
| 2020/0061714 A1 | 2/2020 | Hirose et al. | |

FOREIGN PATENT DOCUMENTS

| | | |
|---|---|---|
| JP | 2005-150362 A | 6/2005 |
| JP | 2006-147801 A | 6/2006 |
| JP | 2006-303240 A | 11/2006 |

(Continued)

OTHER PUBLICATIONS

U.S. Office Action mailed Mar. 31, 2023 for copending U.S. Appl. No. 16/840,621, 6 pages.

(Continued)

*Primary Examiner* — Robert K Carpenter
(74) *Attorney, Agent, or Firm* — Fujitsu Intellectual Property Center

(57) ABSTRACT

In order to provide a conductive heat radiation film that can stabilize the shape, a method of manufacturing a conductive heat radiation film 30 includes: a first heated film 28 including a plurality of first metal particles 27b; and a plurality of carbon nanotubes 24 including tips 24a adhered to the first heated film 28.

15 Claims, 21 Drawing Sheets

(56) References Cited

FOREIGN PATENT DOCUMENTS

| | | |
|---|---|---|
| JP | 2014-127535 A | 7/2014 |
| WO | 2017/115831 A1 | 7/2017 |

OTHER PUBLICATIONS

U.S. Office Action mailed Jun. 8, 2023 for copending U.S. Appl. No. 16/840,621, 12 pages.
U.S. Office Action mailed Jan. 6, 2023 for copending U.S. Appl. No. 16/840,621, 7 pages.
U.S. Office Action mailed Sep. 27, 2023 for copending U.S. Appl. No. 16/840,621, 7 pages.

* cited by examiner

CONDUCTIVE HEAT RADIATION FILM, METHOD OF MANUFACTURING THE SAME, AND METHOD OF MANUFACTURING ELECTRONIC DEVICE

CROSS-REFERENCE TO RELATED APPLICATION

This application is a divisional of U.S. patent application Ser. No. 16/840,621, filed Apr. 6, 2020, which is based upon and claims the benefit of priority of the prior Japanese Patent Application No. 2019-088241 filed on May 8, 2019, the entire contents of which are incorporated herein by reference.

FIELD

A certain aspect of the embodiments is related to a conductive heat radiation film, a method of manufacturing the same, and a method of manufacturing an electronic device.

BACKGROUND

Various electronic devices are mounted on servers, electric vehicles, and the like. Such electronic devices include a central processing unit (CPU), an amplifier, and a vehicle-mounted integrated circuit (IC), for example. Each of these electronic devices is connected to a heat radiation component such as a heat spreader through a heat radiation film in order to radiate heat generated during operation of the electronic devices to the outside.

There is proposed a film including carbon nanotubes as the heat radiation film. Since the carbon nanotubes have a very high thermal conductivity of 1500 W/m·K and are material with excellent flexibility and heat resistance, the carbon nanotubes are suitable for the heat radiation film. The heat radiation film including the carbon nanotubes also has conductivity, and is suitable for electrical connection of the electronic device. Note that the technique related to the present disclosure is disclosed in Japanese Laid-open Patent Publications Nos. 2005-150362, 2006-147801, 2006-303240 and 2014-127535, and International Publication Pamphlet No. WO2017/115831.

However, the conductive heat radiation film including the carbon nanotubes has room for improvement in terms of stabilizing the shape.

SUMMARY

According to an aspect of the present disclosure, there is provided a conductive heat radiation film including: a first heated film including a plurality of first metal particles; and a plurality of carbon nanotubes including tips adhered to the first heated film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Prior to the description of the present embodiment, matters studied by an inventor are described.

The carbon nanotubes have a very high thermal conductivity and a high conduction density as described above, and are therefore suitable for a conductive heat radiation film. Adhering the conductive heat radiation film to the electronic device can discharge heat and electrons generated in the electronic device to the outside with low resistance via the carbon nanotubes.

FIGS. 1A to 2B are cross-sectional views of the electronic device using the conductive heat radiation film of the carbon nanotubes in the middle of manufacturing.

Figure 1A:
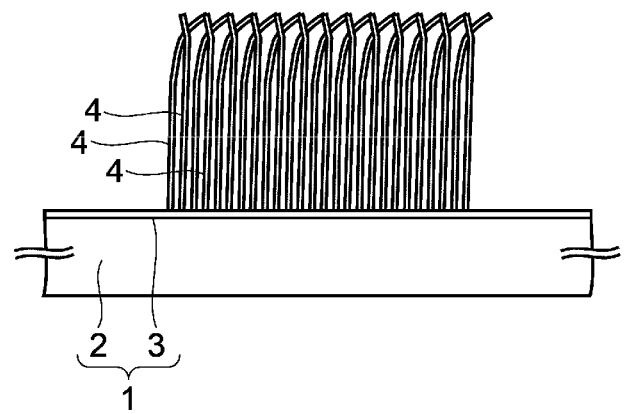
FIGS. 1A and 1B are cross-sectional views of an electronic device using a conductive heat radiation film of carbon nanotubes in the middle of manufacturing (part 1)

First, a substrate 1 including a silicon wafer 2 and a silicon oxide film 3 formed on a surface of the silicon wafer 2 is prepared, and a plurality of carbon nanotubes 4 are grown on the substrate 1 by a CVD (Chemical Vapor Deposition) method, as illustrated in FIG. 1A.

Figure 1B:
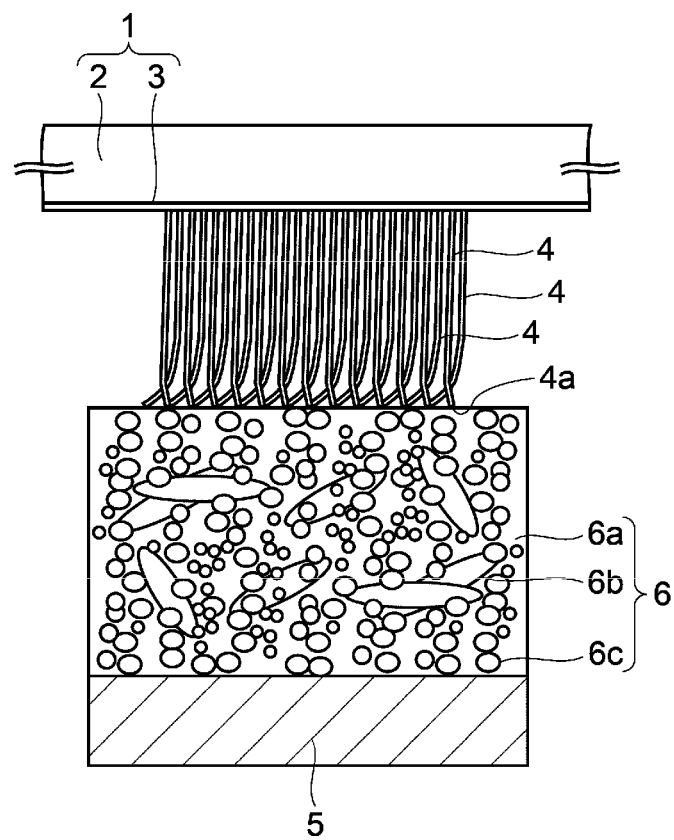

Next, a paste 6 in which metal fillers 6b such as silver and metal particles 6c are dispersed in a solvent 6a is applied to the surface of an electronic device 5 such as a CPU, as illustrated in FIG. 1B. Each of the metal fillers 6b is a copper filler having a diameter of approximately several hundreds μm, for example. Each of the metal particles 6c is a copper particle having a diameter of approximately several tens nm, for example. The diameter of the metal filler 6b is larger than that of the metal particle 6c. The substrate 1 and the electronic device 5 pressurize each carbon nanotube 4 to closely adhere a tip 4a of each carbon nanotube 4 to the surface of the paste 6.

Figure 2A:
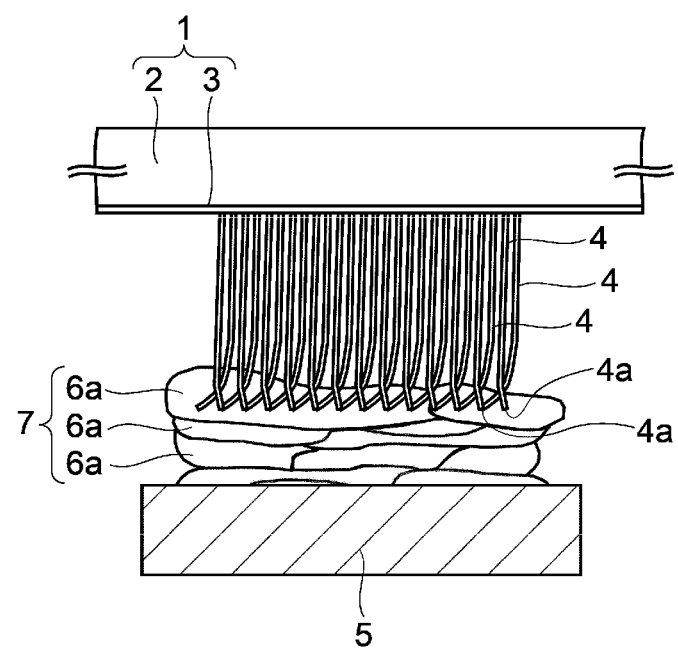
FIGS. 2A and 2B are cross-sectional views of the electronic device using the conductive heat radiation film of the carbon nanotubes in the middle of manufacturing (part 2)

Next, the heating of the substrate 1 volatilizes the solvent 6a, each metal particle 6c is heated to form a metal film 7, and the tip 4a of each carbon nanotube 4 is adhered to the metal film 7, as illustrated in FIG. 2A.

Figure 2B:
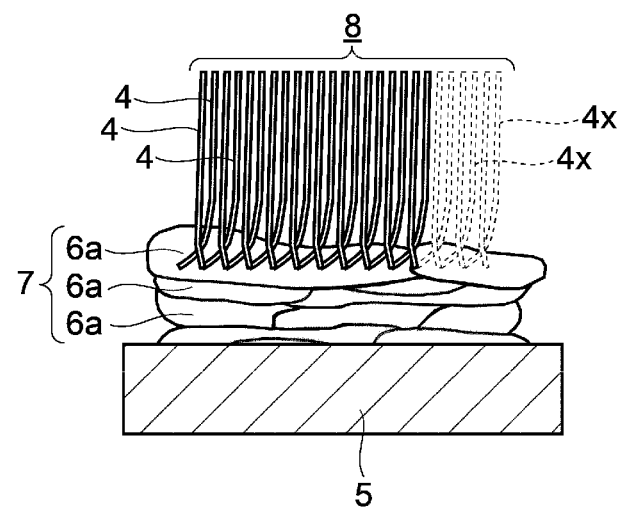

Then, the substrate 1 is peeled from each carbon nanotube 4 to leave the carbon nanotube 4 on the electronic device 5, as illustrated in FIG. 2B.

Thereby, a structure in which a conductive heat radiation film 8 including the plurality of carbon nanotubes 4 is adhered to the metal film 7 is completed. According to such a structure, it is considered that the heat generated in the electronic device 5 is quickly radiated to the outside through the metal film 7 and the carbon nanotubes 4, and the heat radiation of the electronic device 5 is promoted.

However, in this method, when each carbon nanotube 4 is peeled from the substrate 1 in a process of FIG. 2B, a part 4x of the carbon nanotubes 4 is peeled from the metal film 7 together with the substrate 1.

When the part 4x of the carbon nanotubes 4 is lost in this manner, the area of the conductive heat radiation film 8 reduces, so that it is difficult to discharge the heat and the electrons of the electronic device 5 to the outside through the conductive heat radiation film 8.

In order to avoid the above problem, it is considered to manufacture the conductive heat radiation film as follows.

Figure 3A:
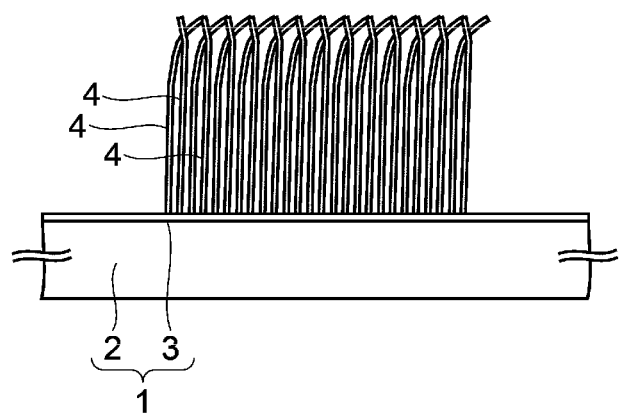
FIGS. 3A and 3B are cross-sectional views of the conductive heat radiation film in the middle of manufacturing studied by an inventor.
Figure 3B:
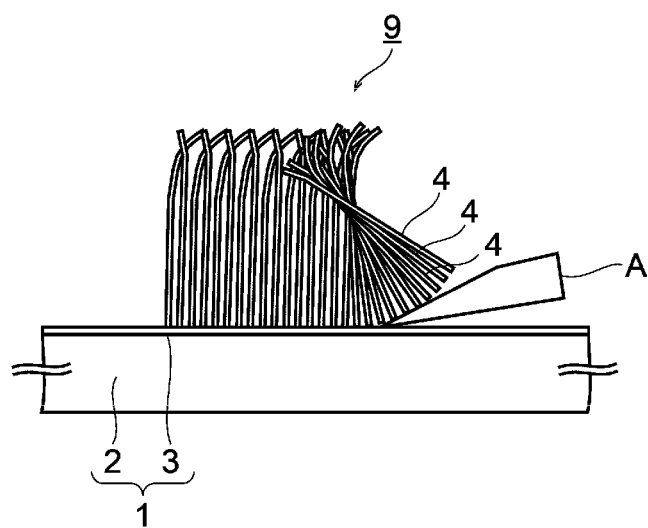

FIGS. 3A and 3B are cross-sectional views of the conductive heat radiation film in the middle of manufacturing studied by an inventor.

First, the execution of the same process as that in FIG. 1A acquires the structure in which the plurality of carbon nanotubes 4 are grown on the substrate 1, as illustrated in FIG. 3A.

Next, each carbon nanotube 4 is mechanically peeled from the substrate 1 using a blade A, and the peeled carbon nanotube 4 becomes a conductive heat radiation film 9, as illustrated in FIG. 3B.

Figure 4:
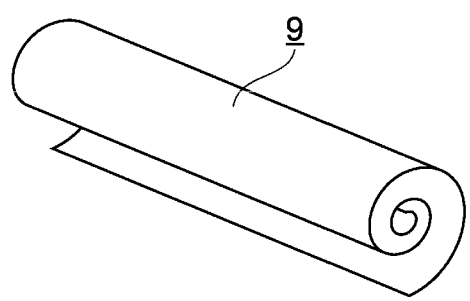
FIG. 4 is an appearance view of the conductive heat radiation film studied by the inventor.

FIG. 4 is an appearance view of the conductive heat radiation film 9 acquired in this manner.

When each carbon nanotube 4 is mechanically peeled from the substrate 1 as described above, the conductive heat radiation film 9 curls as illustrated in FIG. 4. In this case, the conductive heat radiation film 9 cannot be applied on a flat surface of the electronic device such as the CPU.

As described above, the conductive heat radiation films 8 and 9 are not stable in shape and cannot be practically used.

Hereinafter, a description is given of embodiments that can stabilize the shape of the conductive heat radiation film.

First Embodiment

FIGS. 5A to 8 are cross-sectional views of the conductive heat radiation film according to a first embodiment in the middle of manufacturing.

Figure 5A:
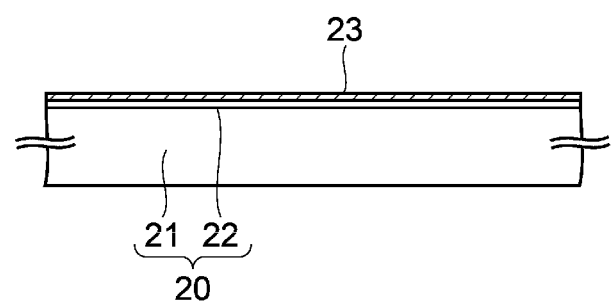
FIGS. 5A and 5B are cross-sectional views of the conductive heat radiation film according to a first embodiment in the middle of manufacturing (part 1)

First, the thermal oxidation of a surface of a silicon wafer 21 forms a silicon oxide film 22 on the surface of the silicon wafer 21, and the silicon wafer 21 and the silicon oxide film 22 are included in a substrate 20, as illustrated in FIG. 5A. The thickness of the silicon oxide film 22 is not particularly limited, but may be formed in a thickness of approximately 1 nm to 1000 nm, for example, approximately 300 nm.

The substrate 20 is not limited to the above example. An alumina substrate, a MgO substrate and a glass substrate may be used as the substrate 20, or a metal substrate such as a stainless substrate may be used as the substrate 20. Also, a metal foil such as a stainless foil or an aluminum foil may be used instead of the substrate 20.

An iron film is formed in a thickness of 0.1 nm to 10 nm, for example, approximately 2.5 nm on the silicon oxide film 22 as a catalyst metal film 23. The catalytic metal film 23 is not limited to the iron film, either. For example, any of cobalt, nickel, iron, gold, silver and platinum can be adopted as the material of the catalyst metal film 23.

Further, a base film may be formed between the silicon oxide film 22 and the catalyst metal film 23. Examples of the material of the base film include molybdenum, titanium, hafnium, zirconium, niobium, vanadium, tantalum nitride, titanium nitride, titanium silicide, aluminum, alumina, titanium oxide, tantalum, tungsten, copper, gold, and platinum. These materials may be used alone as the base film, or the base film may be formed with an alloy of these materials. In this case, a titanium nitride film having a thickness of 5 nm is formed as the base film, and a cobalt film having a thickness of 2.6 nm can be formed on the base film as the catalyst metal film 23, for example.

Further, a plurality of metal particulates whose size is adjusted beforehand using a Differential Mobility Analyzer (DMA) or the like may be adopted instead of the catalytic metal film 23. For example, the titanium nitride film having the thickness of 5 nm is formed as the base film, and cobalt particulates each having an average diameter of 3.8 nm may be formed on the base film.

Figure 5B:
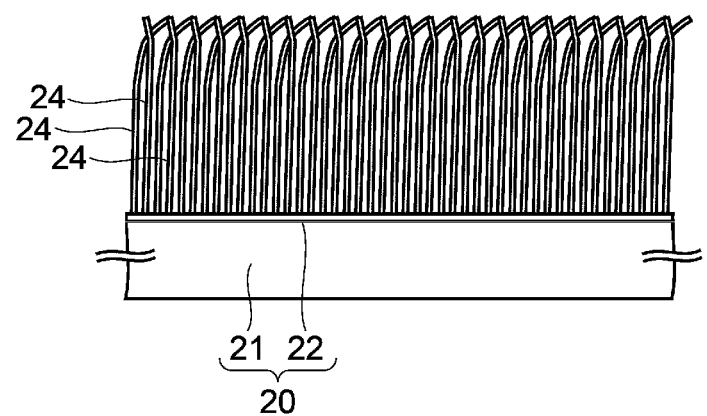

Next, the plurality of carbon nanotubes 24 are grown to a length of 100 μm to 500 μm on the catalytic metal film 23 by a hot filament CVD method, as illustrated in FIG. 5B. In this case, each of the carbon nanotubes 24 linearly extends along a normal direction of the surface of the substrate 20 by the catalytic action of the catalytic metal film 23. The catalyst metal film 23 aggregates and becomes granular at the time of the growth of the carbon nanotubes 24, and the carbon nanotubes 24 grow on the catalyst metal film 23.

The conditions for growing the carbon nanotubes 24 are not particularly limited. In this example, acetylene gas is used as a material gas including carbon, and a mixed gas of the acetylene gas and argon gas is supplied to a growth chamber, not illustrated. A partial pressure ratio between the acetylene gas and the argon gas in the mixed gas is 1:9, and the pressure of the mixed gas in the growth chamber is 1 kPa.

Then, under the growth conditions of a substrate temperature of 620° C., a hot filament temperature of 1000° C. and a growth time of 20 minutes, the carbon nanotubes 24 are grown at a growth rate of approximately 4 μm/min. According to these growth conditions, it is possible to obtain multilayer carbon nanotubes 24 having 3 to 6 layers (e.g. an average of approximately 4 layers). The diameter of each carbon nanotube 24 is 4 to 8 nm, and the average diameter is approximately 6 nm. The surface density of the carbon nanotubes 24 on the surface of the silicon oxide film 22 is approximately $1 \times 10^{11}$ tubes/cm².

The method for growing the carbon nanotubes 24 is not limited to the above-mentioned hot filament CVD method, but may be a thermal CVD method or a remote plasma CVD method. Hydrocarbons such as methane and ethylene, or alcohols such as ethanol and methanol may be used as the material gas including carbon, instead of acetylene. The temperature of the substrate may be between 400° C. and 1000° C., preferably between 600° C. and 800° C.

Figure 6A:
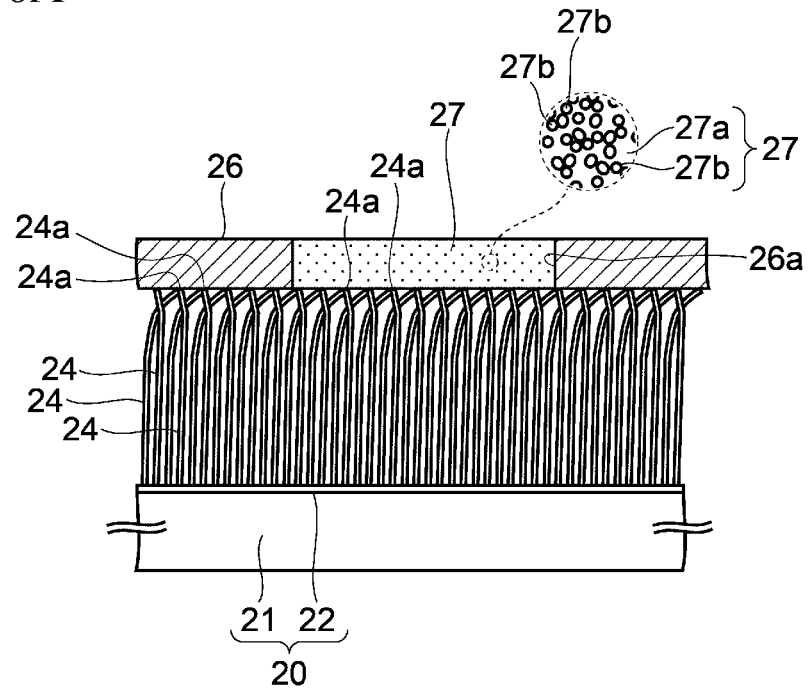
FIGS. 6A and 6B are cross-sectional views of the conductive heat radiation film according to the first embodiment in the middle of manufacturing (part 2)

Next, a metal mask 26 is placed on the tip 24a of each carbon nanotube 24, and a first paste 27 is applied in a thickness of approximately several tens μm to the tip 24a in an opening 26a of the metal mask 26, as illustrated in FIG. 6A.

The first paste 27 is a liquid in which a plurality of metal particles 27b are dispersed in a volatile solvent 27a. The material and the size of the metal particles 27b are not particularly limited. Here, silver particles each having a diameter of approximately several tens nm are used as the metal particles 27b. Such fine metal particles each having a diameter on an order of several tens nm are also called metal nanoparticles, and are heated at a temperature lower than an original melting point of the metal. Note that copper nanoparticles may be used as the metal particles 27b.

Further, the first solvent 27a is not particularly limited, either. However, when polymer is included in the first solvent 27a, the polymer is impregnated into the gaps between the carbon nanotubes 24 by capillary force, and hence it is difficult to apply the first paste 27 to the tip 24a. Therefore, it is preferable to use a liquid including no polymer as the first solvent 27a.

In this example, the first paste 27 is applied to some of the tips 24a of the plurality of carbon nanotubes 24 using the metal mask 26, but the first paste 27 may be applied to all the tips 24a of the plurality of carbon nanotubes 24 without using the metal mask 26.

Figure 6B:
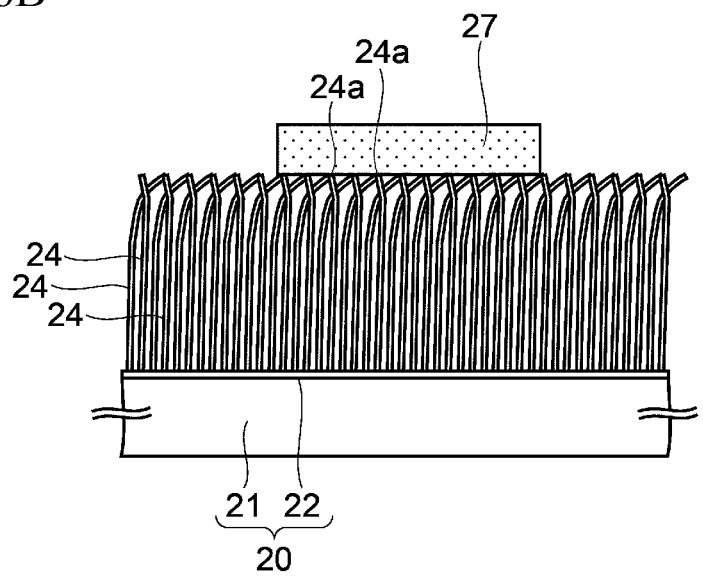

Next, the metal mask 26 is removed from each of the tips 24a of the carbon nanotubes 24, as illustrated in FIG. 6B.

Figure 7A:
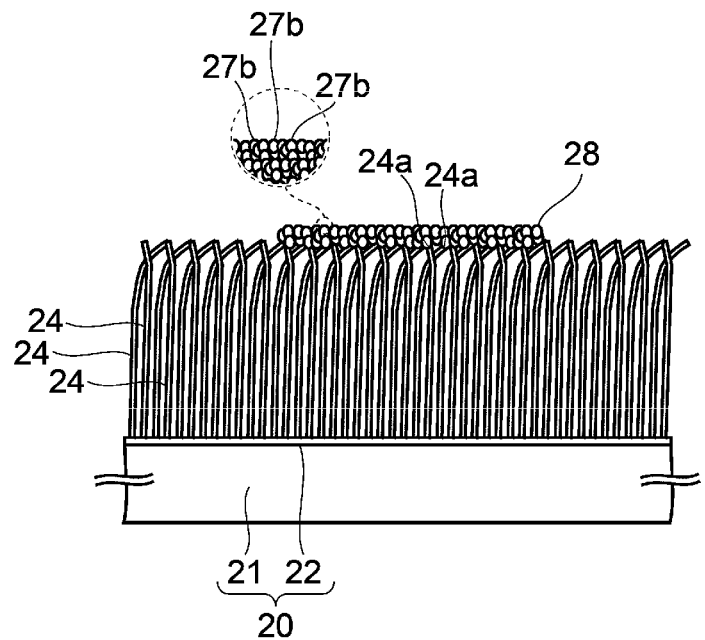
FIGS. 7A and 7B are cross-sectional views of the conductive heat radiation film according to the first embodiment in the middle of manufacturing (part 3)

Next, the substrate 20 is placed in a baking furnace (not illustrated), and the first paste 27 is heated and baked at a temperature of approximately 120 to 130° C. (for example, 120° C., not particularly limited) in the air, as illustrated in FIG. 7A. The heating time is approximately 30 minutes.

Thereby, the first solvent 27a in the first paste 27 is volatilized, and a first heated film 28 in which each of the plurality of silver metal particles 27b is semi-sintered is obtained. The heating is semi-sintering process performed at such a low temperature that the metal particles 27b do not adhered mutually. Inside the first heated film 28 obtained by the heating, each of the metal particles 27b can be displaced to some extent. Then, the tips 24a of the carbon nanotubes 24 adhere to the first heated film 28 and are bound mutually.

When the silver nanoparticles which are hardly oxidized in the air are used as the metal particles 27b as in this example, the first heated film 28 can be formed in the air, and the work of vacuuming the baking furnace due to anti-oxidation can be eliminated.

When the metal particles 27b are the silver nanoparticles like this and are heated at a temperature higher than 130° C., the metal particles 27b adhered mutually, and hence the semi-sintered state cannot be obtained. Therefore, when the silver nanoparticles are used as the metal particles 27b, it is preferable to heat the first paste 27 at a temperature of 130° C. or less to perform the heating. Also when the heating time of the first paste 27 is too long, the heating proceeds and the heated film 28 becomes hard, and hence the heating time is preferably within 1 hour.

In contrast, when the copper nanoparticles are used as the metal particles 27b, semi-sintered state can be obtained by heating the first paste 27 at a temperature of 210° C. or less, for example. The reason for setting an upper limit of the temperature to 210° C. during the heating is that the metal particles 27b adheres mutually and the semi-sintered state cannot be obtained when the temperature is higher than 210° C. Also, since the copper nanoparticles are more easily oxidized than the silver nanoparticles, when the copper nanoparticles are used as the metal particles 27b, it is preferable to perform the heating in a reduced-pressure atmosphere or an inert gas atmosphere, for example, a nitrogen gas atmosphere.

Figure 7B:
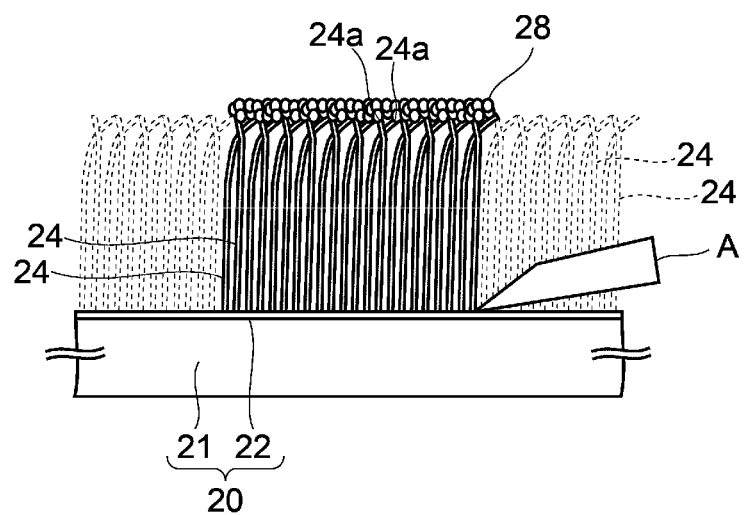

Next, each carbon nanotube 24 on which the first heated film 28 is not formed is mechanically peeled from the substrate 1 using a blade A, as illustrated in FIG. 7B.

Further, each carbon nanotube 24 on which the first heated film 28 is formed is mechanically peeled from the substrate 1 using the blade A. At this time, since the tips 24a of the carbon nanotubes 24 bind with the first heated film 28 in this embodiment, it is possible to suppress the bundle of the carbon nanotubes 24 from curling at the time of peeling as illustrated in the example of FIG. 3B.

Figure 8:
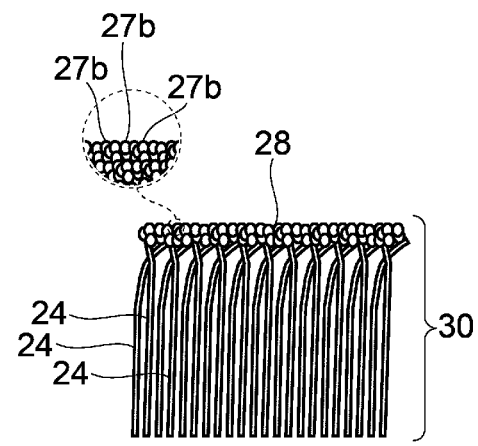
FIG. 8 is a cross-sectional view of the conductive heat radiation film according to the first embodiment in the middle of manufacturing (part 4)

In this way, the basic structure of a conductive heat radiation film 30 according to the first embodiment including the plurality of carbon nanotubes 24 and the first heated film 28 is completed as illustrated in FIG. 8.

According to the first embodiment, adhering the tip 24a of each carbon nanotube 24 to the first heated film 28 can suppress the conductive heat radiation film 30 from curling. Therefore, the shape of the conductive heat radiation film 30 becomes stable and the flatness thereof is good, and it becomes easy to adhere the conductive heat radiation film 30 to a flat surface of a heat sink, a CPU, or the like.

In addition, the metal particles 27b in the first heated film 28 are not adhered to each other, and are in the semi-sintered state that can be sintered by further heating. Therefore, when the first heated film 28 is brought into contact with a component such as the heat sink or the CPU, and the metal particles 27b are heated to be sintered, the conductive heat radiation film 30 can be easily adhered to the component.

Next, the first heated film 28 is described in more detail.

Figure 9A:
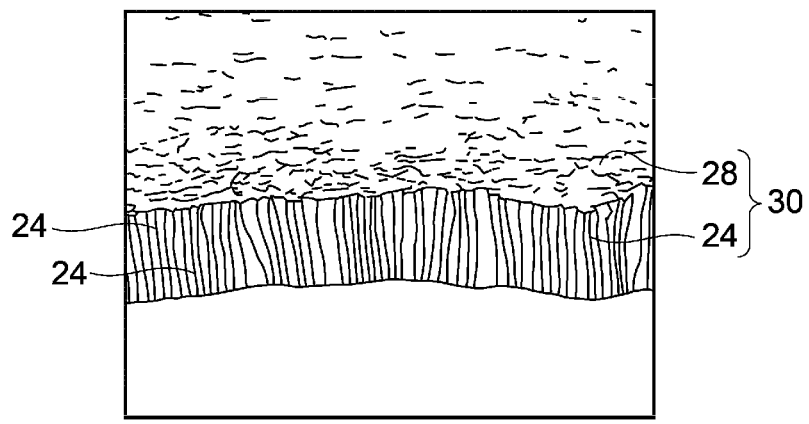
FIG. 9A is a diagram illustrated based on a SEM image of the conductive heat radiation film according to the first embodiment.

FIG. 9A is a diagram illustrated based on a scanning electron microscope (SEM) image of the conductive heat radiation film 30 according to the first embodiment.

Even when the first heated film 28 is formed as described above, each carbon nanotube 24 was not aggregated into a plurality of bundles as illustrated in FIG. 9A. As a result, the flexibility of the conductive heat radiation film 30 can be maintained, and the handling of the conductive heat radiation film 30 becomes easy.

Figure 9B:
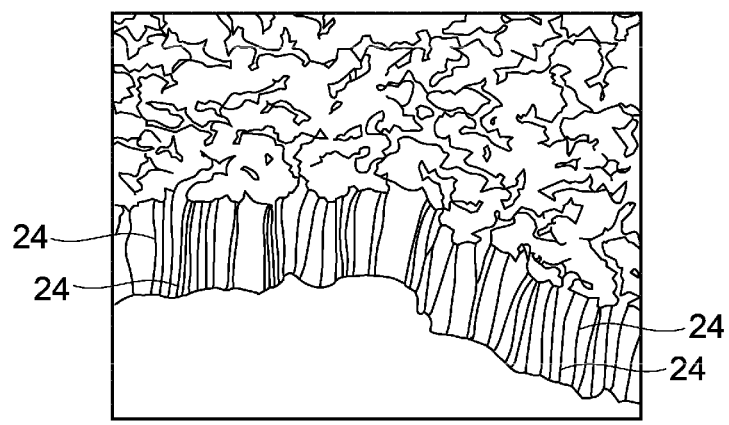
FIG. 9B is a diagram illustrated based on a SEM image of carbon nanotubes when a first paste is heated at a temperature higher than that of the semi-sintering in a process of FIG. 7A.

In contrast, FIG. 9B is a diagram illustrated based on a SEM image of the carbon nanotubes 24 when the first paste 27 was sintered at a temperature higher than the semi-sintering in a process of FIG. 7A. The temperature during the sintering was 150° C., and each of the metal particles 27b was melted and mutually adhered by the sintering.

Hereinafter, melting the metal particles 27b to an extent that the individuality of the metal particles 27b is lost as described above is referred to as sintering. The heating temperature in the sintering is higher than that in the heating. When the metal particles 27b are the silver nanoparticles, the sintering can be performed at a temperature of 180° C. or more. On the other hand, when the metal particles 27b are the copper nanoparticles, the sintering can be performed at a temperature of 250° C. or more.

When the sintering is performed as illustrated in FIG. 9B, each carbon nanotube 24 is aggregated into the plurality of bundles, and hence large gaps were formed between the carbon nanotubes 24. Thereby, the flexibility of the conductive heat radiation film is impaired, and the conductive heat radiation film becomes breakable.

This result revealed that the first paste 27 is preferably kept in the semi-sintered state without executing the sintering, even from the viewpoint of maintaining the flexibility of the conductive heat radiation film 30 and facilitating the handling thereof.

Next, the appearance of the metal particles 27b is described when each of the heating and the sintering was performed.

Figure 10A:
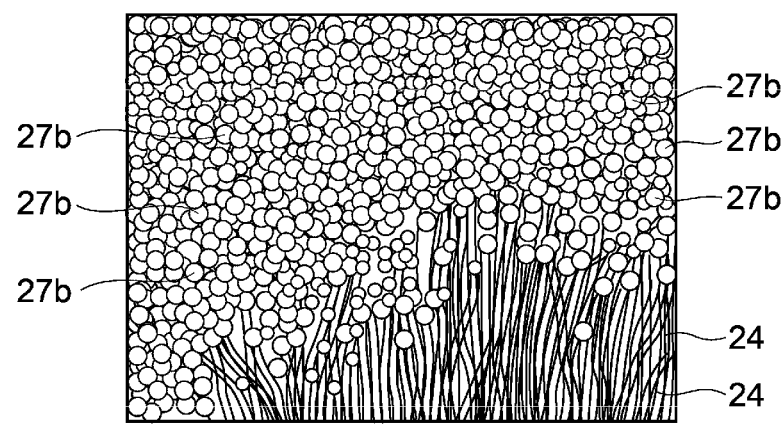
FIG. 10A is a diagram illustrated based on an image obtained by observing the conductive heat radiation film with SEM at a magnification higher than that of FIG. 9A.

FIG. 10A is a diagram illustrated based on an image obtained by observing the conductive heat radiation film 30 with SEM at a magnification higher than that of FIG. 9A.

In the first embodiment, the individuality of the metal particles 27b is maintained, and the metal particles 27b are not adhered to each other as illustrated in FIG. 10A. In this state, since there is room for sintering the metal particles 27b by further heating as described above, it is easy to sinter each of the metal particles 27b and adhere the first heated film 28 to the heat sink or the like.

Figure 10B:
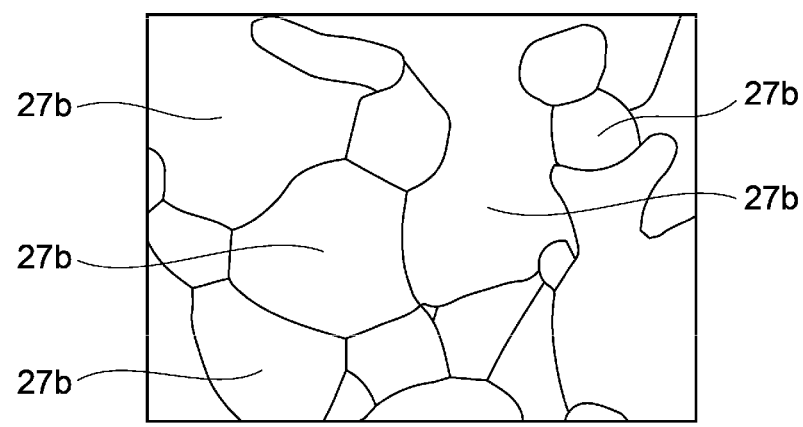
FIG. 10B is a diagram illustrated based on a SEM image of metal particles when the sintering is performed.

In contrast, FIG. 10B is a diagram illustrated based on a SEM image of the metal particles 27b when the sintering is performed at a temperature of 250° C. Note that the magnification of the SEM is the same as the magnification in FIG. 10A.

When the sintering is performed as illustrated in FIG. 10B, each of the metal particles 27b is melted and the diameter thereof is increased. In this state, since the metal particles 27b were already sintered, there is no room for sintering the metal particles 27b by further heating. Therefore, even when the metal particles 27b are adhered to the heat sink or the like by heating, the connection strength deteriorates. Next, a method for manufacturing the electronic device according to the first embodiment is described.

Figure 11A:
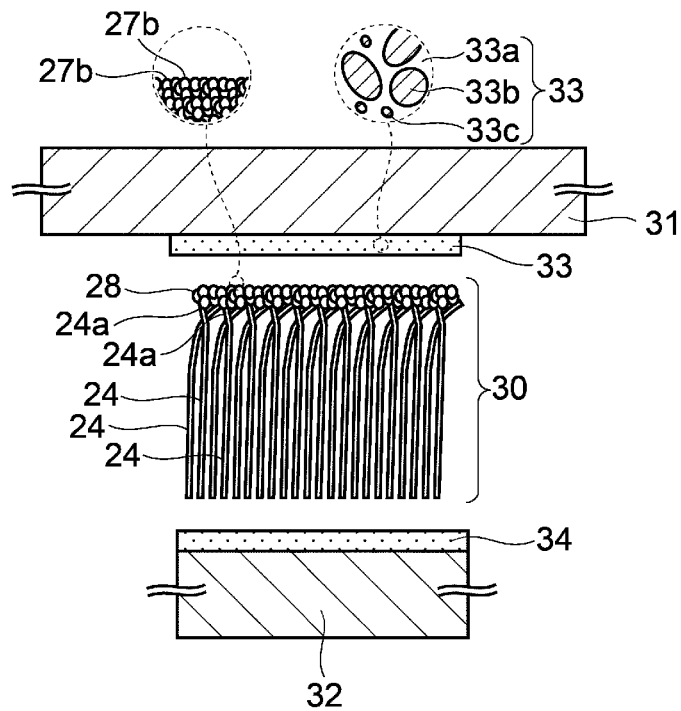
FIGS. 11A and 11B are cross-sectional views of an electronic device according to the first embodiment in the middle of manufacturing (part 1)
Figure 11B:
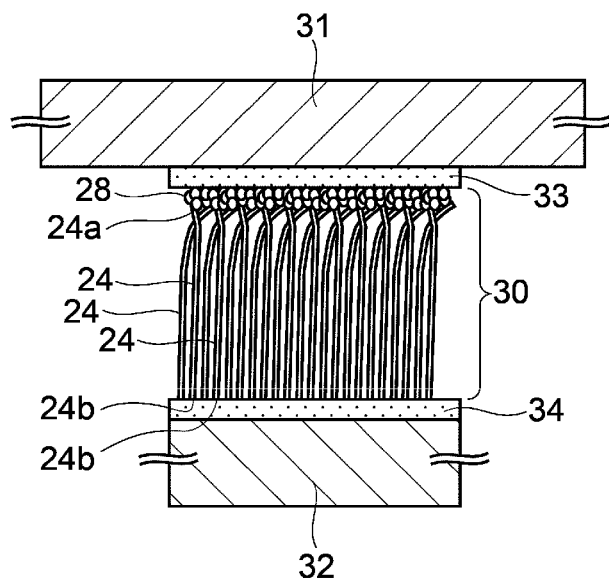
Figure 12:
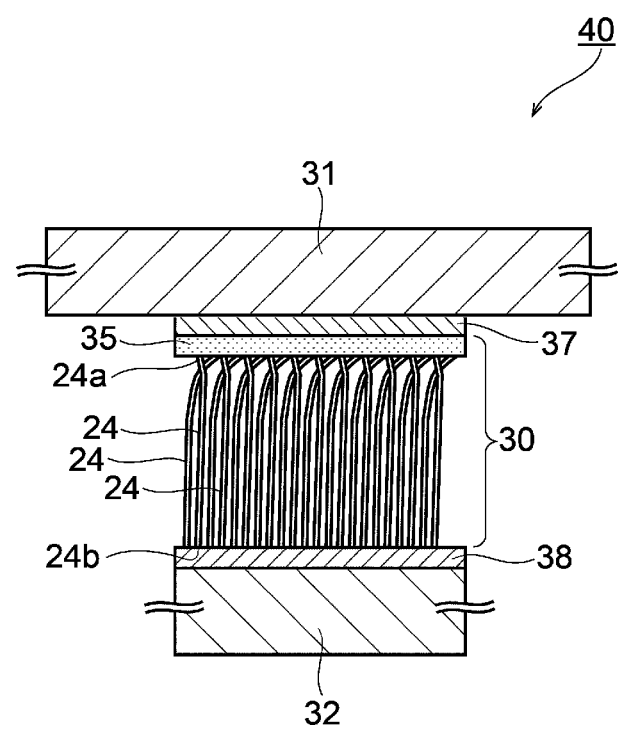
FIG. 12 is a cross-sectional view of the electronic device according to the first embodiment in the middle of manufacturing (part 2)

FIGS. 11A to 12 are cross-sectional views of the electronic device according to the first embodiment in the middle of manufacturing.

First, a heat radiation component such as the heat sink is prepared as a first component 31, and an electronic device is prepared as a second component 32, as illustrated in FIG. 11A. Examples of the electronic device include a high-power amplifier for a mobile phone base station, a semiconductor element such as a CPU for a server or a personal computer (PC), an in-vehicle IC, and so on. Further, a SiC power device for driving a motor of a hybrid vehicle or an electric vehicle may be used as the second component 32.

Then, a paste in which metal fillers 33b and metal particles 33c are dispersed in a solvent 33a is applied to the surface of the first component 31 by a printing method or the like, so that a first coating film 33 is formed on the surface of the first component 31. Each metal filler 33b in the first coating film 33 is a metal particle having a large diameter than that of each metal particle 33c. Here, the copper filler having the diameter of approximately several hundreds μm is used as the metal filler 33b, or the copper particle having the diameter of approximately several tens nm is used as the metal particle 33c. Note that the silver filler and the silver particle may be used instead of the copper filler and the copper particle, respectively.

Further, the same paste as the paste applied to the surface of the first component 31 is applied to the surface of the second component 32, so that the second coating film 34 is formed on the surface of the second component 32.

In this state, the conductive heat radiation film 30 is disposed between the first component 31 and the second component 32, and the first heated film 28 of the conductive heat radiation film 30 is opposed to the first component 31.

When the polymer is added to the solvent of the second coating film 34, the polymer impregnates the gaps between the carbon nanotubes 24 by the capillary force, as described above. In order to avoid this, it is preferable to use the solvent including no polymer as the solvent of the second coating film 34.

In contrast, although the gaps near the tips 24a of the carbon nanotubes 24 are closed by the first heated film 28, the gaps may be opened depending on the semi-sintered state, and the solvent 33a may be impregnated from the tips 24a. Therefore, it is preferable to use the liquid including no polymer as the solvent 33a.

Next, the components 31 and 32 pressurize the conductive heat radiation film 30 to closely adhere the first heated film 28 to the first coating film 33 as illustrated in FIG. 11B. At the same time, the ends 24b of the carbon nanotubes 24 opposite to the tips 24a are closely adhered to the second coating film 34.

At this time, since the shape of the conductive heat radiation film 30 is stable and the flatness thereof is good in the first embodiment as described above, the components 31 and 32 and the conductive heat radiation film 30 closely adhere satisfactorily.

Subsequently, while the conductive heat radiation film 30 is pressurized as described above, the first heated film 28 is sintered by heating, which forms a first sintered film 35 as illustrated in FIG. 12. Further, the coating films 33 and 34 are also sintered by this heating, and become a first metal film 37 and a second metal film 38, respectively.

The heating temperature at this time is 250° C. or more in which the copper nanoparticles and the copper fillers included in each of the coating films 33 and 34 are melted and the first heated film 28 including the silver metal particles 27b is sintered.

Thereby, the first sintered film 35 is adhered to the first component 31 via the first metal film 37. Also, the ends 24b of the carbon nanotubes 24 are connected to the second component 32 via the second metal film 38.

Since the diameter of the metal filler 33b (see FIG. 11A) is larger than that of the metal particle 27b in this example, the plurality of metal particles 27b strongly bind to the metal filler 33b having a large surface area. As a result, the connection strength between the conductive heat radiation film 30 and the first component 31 can be increased.

When the connection strength between the conductive heat radiation film 30 and the first component 31 never be a problem, each of the first coating film 33 and the second coating film 34 may be formed by applying a paste in which the copper nanoparticles are dispersed.

In this way, the basic structure of an electronic device 40 according to the first embodiment is completed.

According to the electronic device 40, the flatness of the conductive heat radiation film 30 is good, and hence the adhesion between the components 31 and 32 and the conductive heat radiation film 30 is improved. As a result, the heat and the electrons generated by the CPU and the like which is the second component 32 can be discharge to the first component 31 through the conductive heat radiation film 30 at low resistance.

The study of the inventor revealed that the shape of the conductive heat radiation film 30 is stabilized in this way, so that the heat conductivity of the conductive heat radiation film 30 becomes 70 W/m·K or more, and the heat resistance thereof also becomes 0.01° C./W or less. As a result, even when the SiC power device having a large calorific value is used as the second component 32 for example, the heat thereof can be quickly radiated, and the heat radiation efficiency of the SiC power device mounted on the hybrid vehicle or the electric vehicle can be increased. Furthermore, the resistivity of the carbon nanotubes 24 connecting the components 31 and 32 to each other is several tens µΩ·cm and very small. Therefore, even when the components 31 and 32 are electrically connected by the carbon nanotubes 24, the carbon nanotubes 24 are less likely to be burned out by a large current, and the reliability of the electronic device 40 can be improved.

Further, since the thermal conductivity of copper included in each of the metal films 37 and 38 is higher than that of silver, the heat generated in the first component 31 is quickly transmitted to the second component 32 and the cooling efficiency of the first component 31 is further improved.

Moreover, since the first heated film 28 is kept in the semi-sintered state without executing the sintering, it is possible to leave room to sinter the metal particles 27b by heating in the process of FIG. 12. For this reason, the sintering of the metal particles 27b in the step of FIG. 12 can strongly connect the carbon nanotubes 24 to the first component 31 via the first sintered film 35.

In addition, since the carbon nanotubes 24 of the conductive heat radiation film 30 can absorb a difference in an amount of thermal expansion between the components 31 and 32, the connection reliability of the components 31 and 32 is improved.

As described above, there are various differences in the properties of the films each obtained by the heating and the sintering.

For example, the density of the first sintered film 35 is larger than that of the first heated film 28 due to the metal particles 27b melted during the sintering. In this way, the metal particles 27b are melted, so that the diameter of each of the metal particles 27b in the first sintered film 35 is larger than that of the first heated film 28, as illustrated in FIGS. 10A and 10B.

Further, as described with reference to FIGS. 9A and 9B, the binding between the metal particles and the agglomeration of the carbon nanotubes 24 caused during the sintering are unlikely to occur in the heating. Therefore, the first heated film 28 is more flexible than the first sintered film 35.

Second Embodiment

In the first embodiment, the first heated film 28 is formed on only the tip 24a of each carbon nanotube 24, as shown in FIG. 8. In contrast, in a second embodiment, the first heated film is formed on not only the tip 24a but also the end of each carbon nanotube 24 opposite to the tip 24a.

FIGS. 13A to 16 are cross-sectional views of the conductive heat radiation film according to the second embodiment in the middle of manufacturing. In FIGS. 13A to 16, elements corresponding to those in the first embodiment are designated by the same reference numerals, and the description thereof is omitted.

Figure 13A:
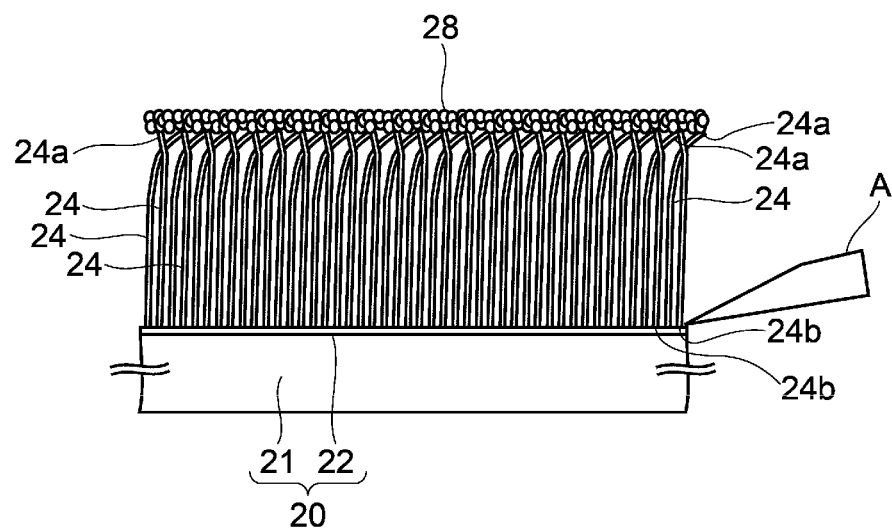
FIGS. 13A and 13B are cross-sectional views of the conductive heat radiation film according to a second embodiment in the middle of manufacturing (part 1)

First, the execution of the process of FIGS. 5A to 7A described in the first embodiment obtains a state in which the first heated film 28 is formed on the tip 24a of each carbon nanotube 24, as illustrated in FIG. 13A. Then, the end 24b of each carbon nanotubes 24 is mechanically peeled from the substrate 20 using the blade A.

Figure 13B:
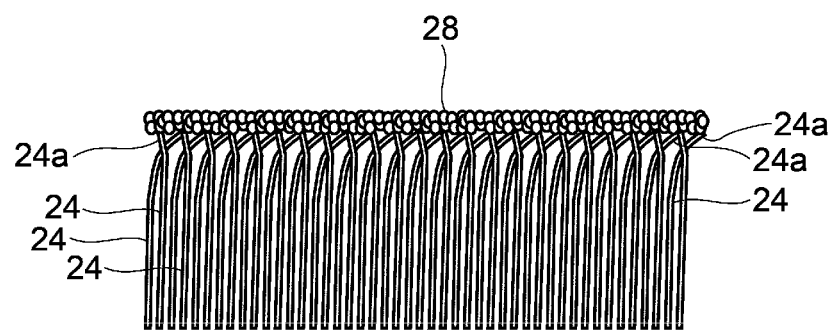

Thereby, a structure in which the tips 24a of the carbon nanotubes 24 adhere to the first heated film 28 is obtained as illustrated in FIG. 13B.

Similarly to the first embodiment, since the tips 24a are bound by the first heated film 28 in the second embodiment, the shapes of each carbon nanotube 24 and the first heated film 28 are stable, thereby suppressing them from curling.

Figure 14A:
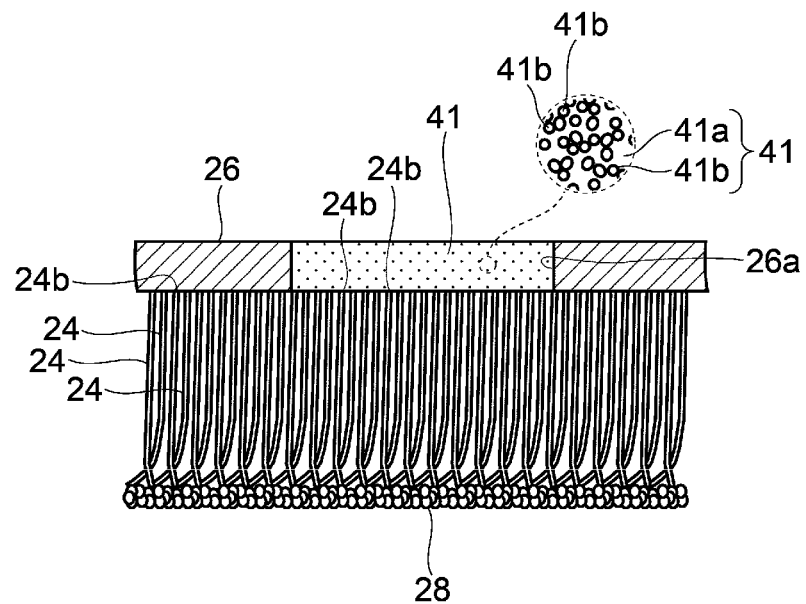
FIGS. 14A and 14B are cross-sectional views of the conductive heat radiation film according to the second embodiment in the middle of manufacturing (part 2)

Next, the metal mask 26 is placed on the end 24b of each carbon nanotube 24, and a second paste 41 is applied in a thickness of approximately several tens µm to the end 24b in the opening 26a of the metal mask 26, as illustrated in FIG. 14A.

As in the first paste 27 (see FIG. 6A), the second paste 41 is a liquid in which metal nanoparticles each having a diameter of approximately several tens nm as a plurality of metal particles 41b are dispersed in a volatile second solvent 41a. The material of the metal particles 41b is not particularly limited, and the metal nanoparticles which are the same as or different from the metal particles 27b can be used as the metal particles 41b.

In the second embodiment, the silver nanoparticles which are hardly oxidized and can be heated in the air are used as the metal particles 41b. Note that copper nanoparticles may be used as the metal particles 41b.

Further, in order to prevent the second solvent 41a from impregnating the gaps between the carbon nanotubes 24 by the capillary force, it is preferable to use the second solvent 41a including no polymer.

Figure 14B:
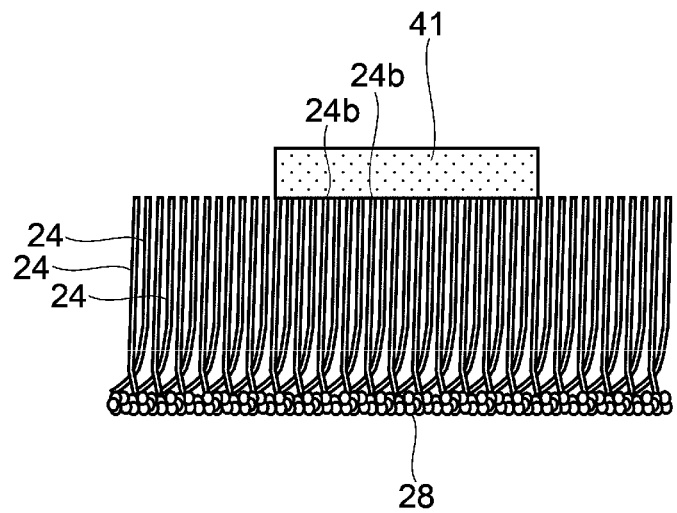

Next, the metal mask 26 is removed from each of the ends 24b of the carbon nanotubes 24, as illustrated in FIG. 14B.

Figure 15A:
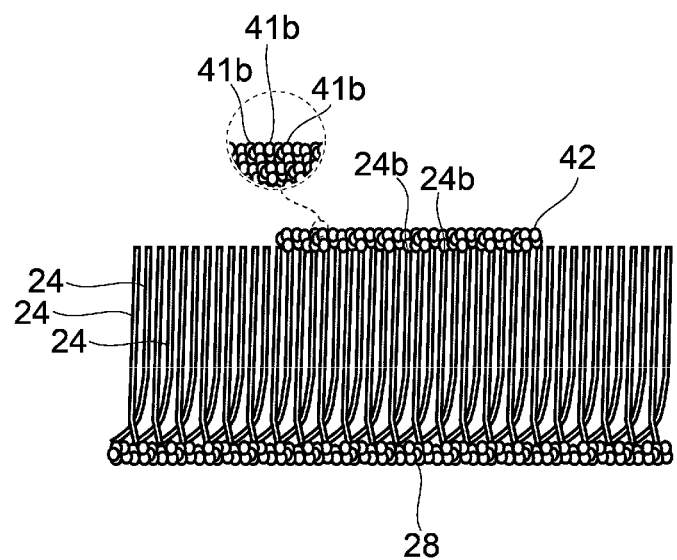
FIGS. 15A and 15B are cross-sectional views of the conductive heat radiation film according to the second embodiment in the middle of manufacturing (part 3)

Next, the carbon nanotubes 24 is placed in a baking furnace (not illustrated), and the second paste 41 is heated and baked in the air (not particularly limited) to form a second heated film 42 in the semi-sintered state, as illustrated in FIG. 15A. The conditions of the heating are not particularly limited. When the second metal particles 41b are the silver nanoparticles like this example, the second paste 41 is heated at a temperature of approximately 120 to 130° C., for example, 120° C., so that the second heated film 42 can be formed. Note that the heating time is approximately 30 minutes.

In contrast, when the metal particles 41b are the copper nanoparticles, the second paste 41 is heated at a temperature of 210° C. or less, for example, approximately 200° C. in the reduced-pressure atmosphere or the inert gas atmosphere, so that the second heated film 42 can be formed.

Also in the second heated film 42, the plurality of metal particles 41b are not adhered to each other, and each of the metal particles 41b can be displaced inside the second heated film 42 to some extent, as in the first heated film 28. Then, the ends 24b of the carbon nanotubes 24 are adhered to the second heated film 42 and are bound mutually.

Figure 15B:
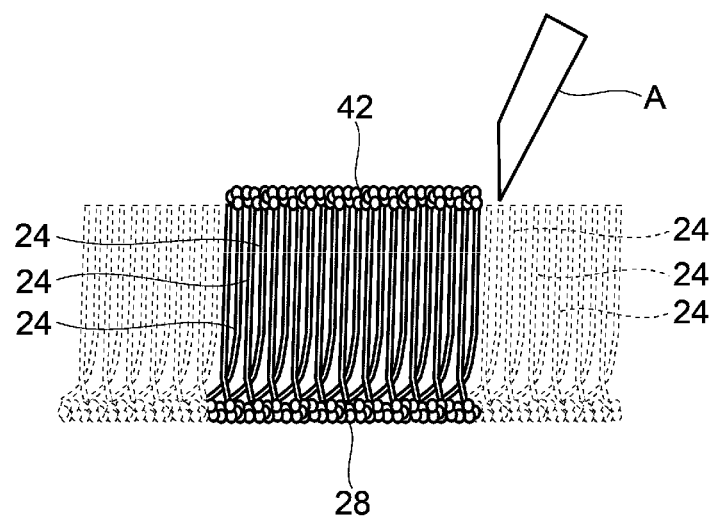

Next, each carbon nanotube 24 on which the second heated film 42 is not formed is removed using the blade A, as illustrated in FIG. 15B.

Figure 16:
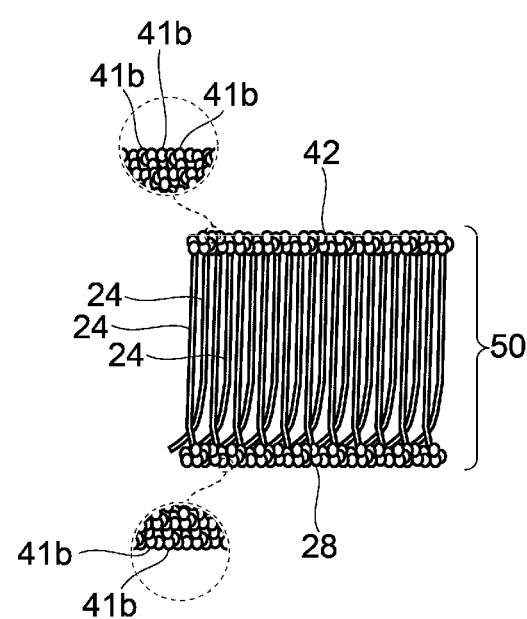
FIG. 16 is a cross-sectional view of the conductive heat radiation film according to the second embodiment in the middle of manufacturing (part 4)

In this way, the basic structure of a conductive heat radiation film 50 according to the second embodiment including the plurality of carbon nanotubes 24 and the first and the second heated films 28 and 42 is completed as illustrated in FIG. 16.

According to the second embodiment described above, the first and the second heated films 28 and 42 are provided on both surfaces of the conductive heat radiation film 50, respectively. The metal particles 27b in the first heated film 28 are not adhered to each other, and metal particles 42b in the second heated film 42 are also not adhered to each other. The metal particles 27b and 42b are in a state of being easily sintered by further heating. Therefore, when the components such as the heat sink or the CPU are brought into contact with both surfaces of the conductive heat radiation film 50, and the first and the second heated films 28 and 42 are heated and sintered, the components can be easily adhered to both surfaces of the conductive heat radiation film 50.

Moreover, when each carbon nanotube 24 is peeled from the substrate 20 in the process of FIG. 13A, the first heated film 28 can suppress each carbon nanotube 24 from curling, and improve the flatness of the conductive heat radiation film 50.

Next, an electronic device according to the second embodiment using the conductive heat radiation film 50 is described.

Figure 17A:
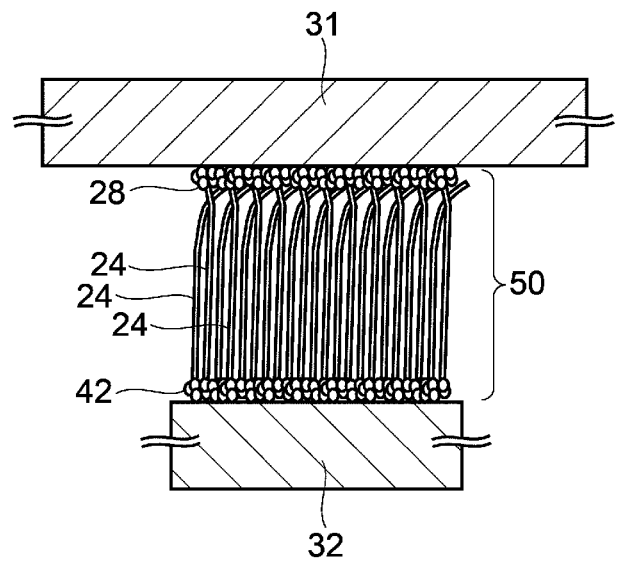
FIGS. 17A and 17B are cross-sectional views of an electronic device according to the second embodiment in the middle of manufacturing.
Figure 17B:
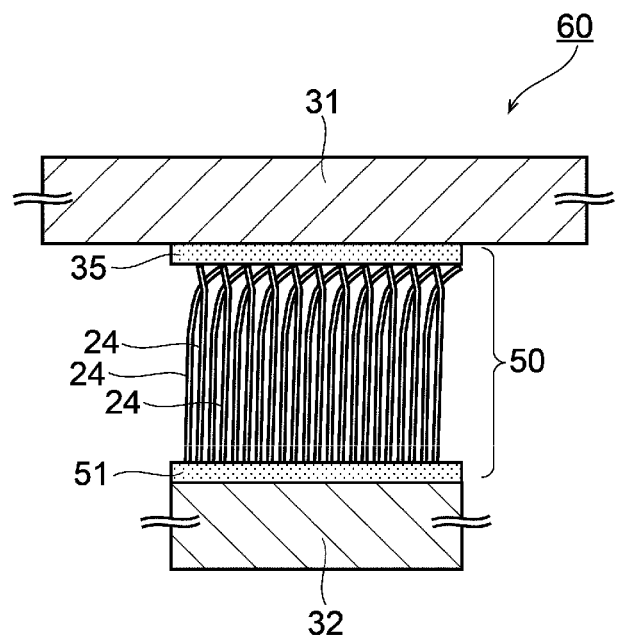

FIGS. 17A and 17B are cross-sectional views of the electronic device according to the second embodiment in the middle of manufacturing. In FIGS. 17A and 17B, elements corresponding to those in the first embodiment are designated by the same reference numerals, and the description thereof is omitted.

First, the heat radiation component such as the heat sink is prepared as the first component 31, and the electronic device such as the CPU is prepared as the second component 32, as illustrated in FIG. 17A.

Then, while the first heated film 28 is brought into contact with the first component 31 and the second heated film 42 is brought into contact with the second component 32, the conductive heat radiation film 50 is pressurized by the components 31 and 32.

Next, the heated films 28 and 42 are heated and sintered at a temperature of 180° C. or more in the air, so that the first heated film 28 becomes the first sintered film 35, and the second heated film 42 becomes a second sintered film 51, as illustrated in FIG. 17B.

Thereby, the sintered films 35 and 51 are adhered to the first component 31 and the second component 32 respectively, and the conductive heat radiation film 50 is connected to the components 31 and 32.

In this way, the basic structure of a conductive heat radiation film 60 according to the second embodiment is completed.

According to the above-described second embodiment, since the flatness of the conductive heat radiation film 50 is good, the adhesion between the conductive heat radiation film 50 and each of the components 31 and 32 is improved, and the heat of the second component 32 can be efficiently radiated to the first component 31.

Third Embodiment

In a third embodiment, a description is given of an electronic device capable of improving the connection strength between the conductive heat radiation film 50 and each of the components 31 and 32.

Figure 18A:
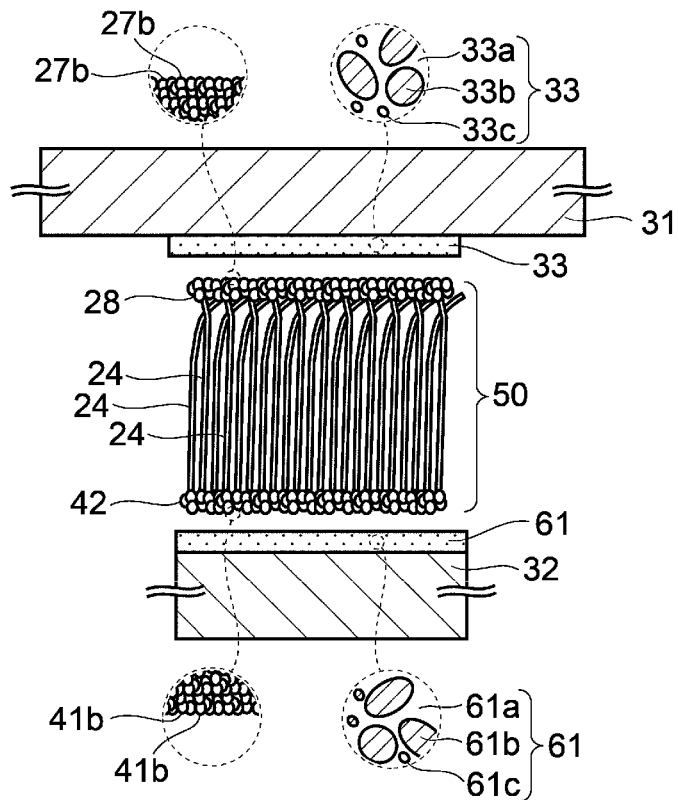
FIGS. 18A and 18B are cross-sectional views of an electronic device according to a third embodiment in the middle of manufacturing (part 1)
Figure 18B:
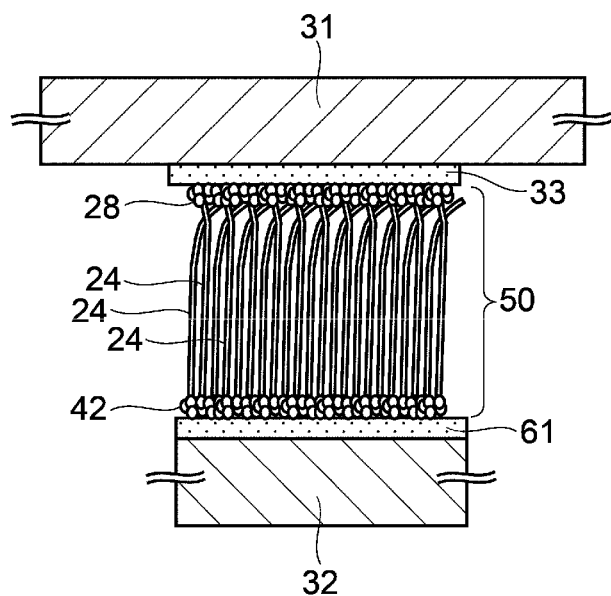
Figure 19:
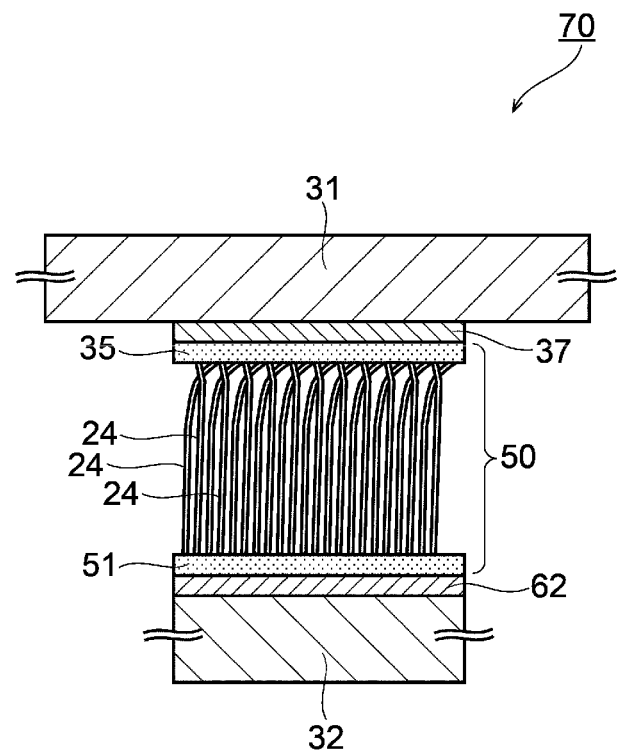
FIG. 19 is a cross-sectional view of the electronic device according to the third embodiment in the middle of manufacturing (part 2)

FIGS. 18A to 19 are cross-sectional views of the electronic device according to the third embodiment in the middle of manufacturing. In FIGS. 18A to 19, elements corresponding to those in the first embodiment and the second embodiment are designated by the same reference numerals, and the description thereof is omitted.

First, as illustrated in FIG. 18A, the first coating film 33 is formed on the surface of the first component 31 such as the heat sink by a printing method, for example. As described in the first embodiment, the first coating film 33 is formed from the paste in which the metal particles 33c, and the metal fillers 33b each having a diameter larger than the diameter of each of the metal particles 27b are dispersed in the solvent 33a. The material of the metal fillers 33b is not particularly limited. In the third embodiment, the copper filler having a diameter of approximately several hundreds μm are used as the metal filler 33b, and the copper particle having a diameter of approximately several tens μm are used as the metal particle 33c. Note that the silver filler and the silver particle may be used instead of the copper filler and the copper particle, respectively.

Then, a paste in which metal fillers 61b and metal particles 61c are dispersed in a solvent 61a is applied to the surface of the second component 32 by the printing method or the like, so that a third coating film 61 is formed on the surface of the second component 32 such as the CPU. The material of the metal filler 61b is not particularly limited as long as the metal filler 61b has a diameter larger than that of the metal particle 61c. The metal particle which is the same as or different from the metal filler 33b is used as the metal filler 61b. In the third embodiment, the copper filler having the diameter of approximately several hundreds μm is used as the metal filler 61b. Note that the silver filler and the silver particle may be used instead of the copper filler and the copper particle, respectively.

Then, the conductive heat radiation film 50 is disposed between the components 31 and 32 such that the first heated film 28 is opposed to the first component 31, and the second heated film 42 is opposed to the second component 32.

Next, the conductive heat radiation film 50 is pressurized by the components 31 and 32, as illustrated in FIG. 18B.

Next, the heated films 28 and 42 are heated to be sintered while the conductive heat radiation film 50 is pressurized, as illustrated in FIG. 19. Thereby, the heated films 28 and 42 become the first sintered film 35 and the second sintered film 51, respectively. In addition, the coating films 33 and 61 are also sintered by this heating, and become the first metal film 37 and a third metal film 62, respectively.

The heating temperature at this time is 250° C. or more in which the copper metal fillers 33b and 61b included in the coating films 33 and 61 are melted, and the heated films 28 and 42 including the silver metal particles 27b and 41b are sintered.

Thereby, the first sintered film 35 is adhered to the first component 31 via the first metal film 37, the second sintered film 51 is connected to the second component 32 via the third metal film 62, and the conductive heat radiation film 50 is connected to each of the components 31 and 32.

In this way, the basic structure of a conductive heat radiation film 70 according to the third embodiment is completed.

In the above-mentioned third embodiment, the metal particles 27b strongly bind to the metal fillers 33b larger than them, so that it is possible to increase the connection strength between the conductive heat radiation film 50 and the first component 31. Similarly, the metal particles 41b strongly bind to the metal fillers 61b larger than them, so that it is possible to increase the connection strength between the conductive heat radiation film 50 and the second component 32. Furthermore, the resistivity of the carbon nanotubes 24 connecting the components 31 and 32 is several tens µΩ·cm and very small. Therefore, even when the components 31 and 32 are electrically connected by the carbon nanotubes 24, the carbon nanotubes 24 are less likely to be burned out by a large current, and the reliability of the electronic device 70 can be improved.

The carbon nanotubes 24 have not only high thermal conductivity but also low electric resistance. Therefore, the conductive heat radiation films described so far are suitable as the material for electrically connecting two components to each other. When the two components are electronic components in the first to third embodiments, it is preferable to electrically connect the two components with the conductive heat radiation film. Here, a description is given of an example in which the two components are electrically connected with the conductive heat radiation film 50 described in the second embodiment.

Figure 20A:
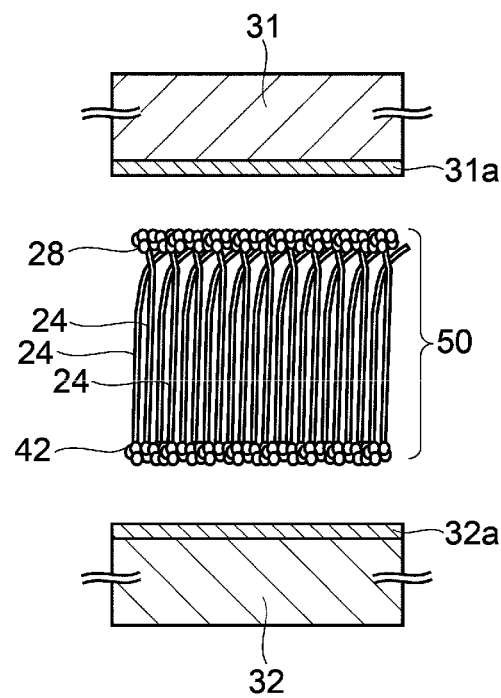
FIGS. 20A and 20B are cross-sectional views of an electronic device in which two components are electrically connected with the conductive heat radiation film of the second embodiment in the middle of manufacturing (part 1)
Figure 20B:
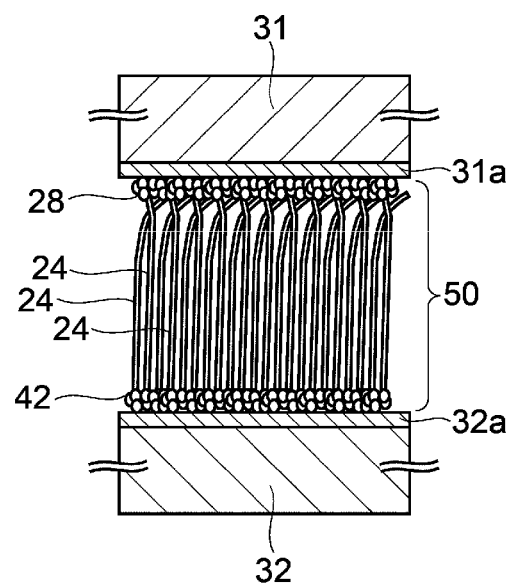
Figure 21:
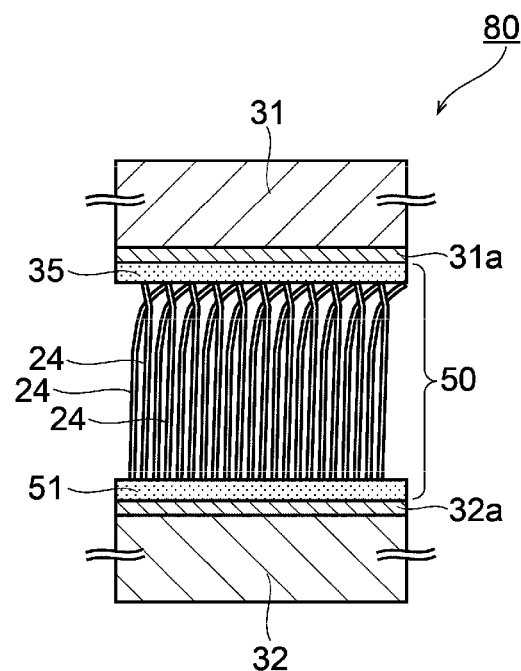
FIG. 21 is a cross-sectional view of the electronic device in which the two components are electrically connected with the conductive heat radiation film of the second embodiment in the middle of manufacturing (part 2).

FIGS. 20A to 21 are cross-sectional views of an electronic device according to this example in the middle of manufacturing. In FIGS. 20A to 21, elements corresponding to those in the first to the third embodiments are designated by the same reference numerals, and the description thereof is omitted.

First, the conductive heat radiation film 50 is disposed between the first component 31 and the second component 32 as illustrated in FIG. 20A. In this example, the electronic device such as the CPU or the SiC power device is used as each of the components 31 and 32. Then, a first electrode 31a of the first component 31 is opposed to the first heated film 28, and a second electrode 32a of the second component 32 is opposed to the second heated film 42.

Next, the conductive heat radiation film 50 is pressurized by the components 31 and 32. Thus, the first heated film 28 is brought into contact with the first electrode 31a, and the second heated film 42 is brought into contact with the second electrode 32a, as illustrated in FIG. 20B.

Then, while pressurizing the conductive heat radiation film 50, each of the heated films 28 and 42 is heated and sintered at a temperature of approximately 180° C. in the air, as illustrated in FIG. 21. Thereby, the first heated film 28 becomes the first sintered film 35, and each carbon nanotube 24 is mechanically and electrically connected to the first electrode 31a by the first sintered film 35. Similarly, the second heated film 42 becomes the second sintered film 51, and each carbon nanotube 24 is mechanically and electrically connected to the second electrode 32a by the second sintered film 51.

In this way, the basic structure of a conductive heat radiation film 80 according to this example is completed.

According to the above-mentioned example, the resistivity of the carbon nanotubes 24 connecting the components 31 and 32 is several tens µΩ·cm and very small. Therefore, even when each of the components 31 and 32 is a device using the large current such as the SiC power device, the carbon nanotubes 24 are less likely to be burned out by the large current, and the reliability of the electronic device 80 can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A method of manufacturing a conductive heat radiation film, comprising:
    growing a plurality of carbon nanotubes over a substrate;
    applying a first paste including a plurality of first metal particles to a tip of each of the carbon nanotubes, the plurality of first metal particles being metal nanoparticles;
    forming a first heated film by heating the first paste at a temperature lower than an original melting point of the plurality of metal particles so that the first metal particles contact each other without other materials therebetween, can be displaced each other, and do not adhered mutually; and
    peeling each of the carbon nanotubes from the substrate after forming the first heated film.

2. The method of manufacturing the conductive heat radiation film as claimed in claim 1, wherein
    each of the first metal particles includes silver, and
    the temperature of the first paste at the time of the heating is 130° C. or less.

3. The method of manufacturing the conductive heat radiation film as claimed in claim 1, wherein
    each of the first metal particles includes copper, and
    the temperature of the first paste at the time of the heating is 210° C. or less.

4. The method of manufacturing the conductive heat radiation film as claimed in claim 1, wherein the first metal particles in the first heated film are not adhered to each other.

5. The method of manufacturing the conductive heat radiation film as claimed in claim 1, further comprising:
    applying a second paste including a plurality of second metal particles to each of the ends of the plurality of carbon nanotubes opposite to the tips after the peeling; and
    forming a second heated film by heating the second paste.

6. A method of manufacturing an electronic device, comprising:
    growing a plurality of carbon nanotubes over a substrate;
    applying a first paste including a plurality of first metal particles to a tip of each of the carbon nanotubes, the plurality of first metal particles being metal nanoparticles;
    forming a first heated film by heating the first paste at a temperature lower than an original melting point of the plurality of metal particles so that the first metal particles contact each other without other materials therebetween, can be displaced each other, and do not adhered mutually;
    peeling each of the carbon nanotubes from the substrate after forming the first heated film;
    forming a first sintered film adhered to a first component by sintering the first heated film in a state where the first heated film is in contact with the first component after the peeling; and
    connecting the ends of the carbon nanotubes opposite to the tips to a second component after the peeling.

7. The method of manufacturing the electronic device as claimed in claim 6, wherein a temperature of the first heated film at the time of the sintering is higher than a temperature of the first paste at the time of the heating.

8. The method of manufacturing the electronic device as claimed in claim 7, wherein
each of the first metal particles includes silver,
the temperature of the first paste at the time of the heating is 130° C. or less, and
the temperature of the first heated film at the time of the sintering is 180° C. or more.

9. The method of manufacturing the electronic device as claimed in claim 7, wherein
each of the first metal particles includes copper,
the temperature of the first paste at the time of the heating is 210° C. or less, and
the temperature of the first heated film at the time of the sintering is 250° C. or more.

10. The method of manufacturing the electronic device as claimed in claim 6, wherein a density of the first sintered film is higher than a density of the first heated film.

11. The method of manufacturing the electronic device as claimed in claim 6, wherein a diameter of the first metal particle in the first sintered film is larger than a diameter of the first metal particle in the first heated film.

12. The method of manufacturing the electronic device as claimed in claim 6, wherein the first heated film is more flexible than the first sintered film.

13. The method of manufacturing the electronic device as claimed in claim 6, wherein the forming the first sintered film includes:
forming a first coating film including a first metal filler having a diameter larger than a diameter of the first metal particle on a surface of the first component; and
the forming the first sintered film is performed by sintering the first heated film in a state where the first heated film is in contact with the first coating film.

14. The method of manufacturing the electronic device as claimed in claim 6, further comprising:
applying a second paste including a plurality of second metal particles to each of the ends of the plurality of carbon nanotubes opposite to the tips after the peeling; and
forming a second heated film by heating the second paste;
wherein the connecting the ends of the carbon nanotubes to the second component is performed by forming a second sintered film adhered to the second component by sintering the second heated film in a state where the second heated film is in contact with the second component.

15. The method of manufacturing the electronic device as claimed in claim 14, wherein the connecting the ends of the carbon nanotubes to the second component includes:
forming a second coating film including a second metal filler having a diameter larger than a diameter of the second metal particle on a surface of the second component; and
sintering the second heated film in a state where the second heated film is in contact with the second coating film.

* * * * *